United States Patent [19]
Smith et al.

[11] Patent Number: 6,063,714
[45] Date of Patent: *May 16, 2000

[54] NANOPOROUS DIELECTRIC THIN FILM SURFACE MODIFICATION

[75] Inventors: Douglas M. Smith; Gregory P. Johnston; William C. Ackerman, all of Albuquerque, N.Mex.; Shin-Puu Jeng, Plano, Tex.

[73] Assignee: Texas Instruments Incorporated, Dallas, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/749,186

[22] Filed: Nov. 14, 1996

Related U.S. Application Data

[60] Provisional application No. 60/010,511, Jan. 24, 1996.

[51] Int. Cl.$^7$ .............................. H01L 21/00; B05D 3/04

[52] U.S. Cl. ........................... 438/778; 438/780; 427/58; 427/335; 427/337; 427/344; 427/384

[58] Field of Search ...................................... 437/195, 250, 437/978; 427/58, 384, 335, 337, 344; 438/778, 780

[56] References Cited

U.S. PATENT DOCUMENTS

| | | | |
|---|---|---|---|
| 4,230,803 | 10/1980 | Weidenbach et al. | 435/176 |
| 4,311,738 | 1/1982 | Chi | 427/387 |
| 4,713,233 | 12/1987 | Marsh et al. | 423/608 |

(List continued on next page.)

FOREIGN PATENT DOCUMENTS

| | | | |
|---|---|---|---|
| 0 382 310 A2 | 8/1990 | European Pat. Off. | C01B 33/158 |
| 0 454 239 A2 | 10/1991 | European Pat. Off. | C01B 33/16 |
| 0454239 | 10/1991 | European Pat. Off. | C01B 33/16 |
| WO 92/03378 | 3/1992 | WIPO . | |

OTHER PUBLICATIONS

Siv Hæreid, Preparation And Characterization of Transparent, Monolithic Silica Xerogels With Low Density, Jan. 1993, Norges Tekniske Hogskole Universiteteti I Trondheim.

H. Yokogawa, M. Yokoyama, Hydrophobic Silica Aerogels, Journal of Non–Crystalline Solids 186 (1995) 23–29.

V.S. Klimenko, L.A. Kulik, and V.V. Vashchinskaya, Dependence of the Composition and Structure of Silicic Acid Xerogels on the Nature of the Solvent, 1986, Ukrainskii Khimicheskii Zhurnal, vol. 52, No. 12, pp. 1247–1251.

(List continued on next page.)

*Primary Examiner*—Diana Dudash
*Assistant Examiner*—Michael Barr
*Attorney, Agent, or Firm*—David Denker; Carlton H. Hoel; Frederick J. Telecky, Jr.

[57] ABSTRACT

This pertains generally to precursors and deposition methods suited to aerogel thin film fabrication of nanoporous dielectrics. A method of forming a nanoporous dielectric on a semiconductor substrate is disclosed. By a method according to the present invention, a precursor sol is applied as a nongelling thin film 14 to a semiconductor substrate 10. This substrate may contain patterned conductors 12, gaps 13, and/or other structures. A portion of the solvent is evaporated from the thin film 14 to produce a reduced thickness film 18. Film 18 is gelled and may be aged. A surface modification agent is introduced to the reaction atmosphere in a vaporish form, e.g., a vapor, mist, aerosol, or similar form. The surface modifier can then diffuse into, condense onto, and/or settle onto the wet gel and then diffuse throughout the thin film. This vaporish introduction of the surface modification agent ensures that there are no strong fluid flows across the wafer that might damage the wet gel. It can also be compatible with standard processing equipment and can potentially be used with other reaction atmosphere controls that reduce premature drying of the gel.

22 Claims, 1 Drawing Sheet

U.S. PATENT DOCUMENTS

| | | | |
|---|---|---|---|
| 4,851,150 | 7/1989 | Hench et al. | 252/315.6 |
| 4,954,327 | 9/1990 | Blount | 423/338 |
| 5,076,980 | 12/1991 | Nogues et al. | 264/65 |
| 5,097,317 | 3/1992 | Fujimoto et al. | 357/72 |
| 5,207,814 | 5/1993 | Cogliati et al. | 65/18.3 |
| 5,226,930 | 7/1993 | Sasaki | 51/308 |
| 5,242,647 | 9/1993 | Poco | 264/225 |
| 5,275,796 | 1/1994 | Tillotson et al. | 423/338 |
| 5,294,480 | 3/1994 | Mielke et al. | 428/240 |
| 5,352,637 | 10/1994 | Fabry et al. | 437/238 |
| 5,368,887 | 11/1994 | Hoshino et al. | 427/226 |
| 5,391,364 | 2/1995 | Cogliati | 423/335 |
| 5,409,683 | 4/1995 | Tillotson et al. | 423/338 |
| 5,470,802 | 11/1995 | Gnade et al. | 437/238 |
| 5,472,913 | 12/1995 | Havemann et al. | 437/195 |
| 5,488,015 | 1/1996 | Havemann et al. | 437/195 |
| 5,494,858 | 2/1996 | Gnade et al. | 437/231 |
| 5,496,527 | 3/1996 | Yokogawa et al. | 423/338 |
| 5,504,042 | 4/1996 | Cho et al. | 437/247 |
| 5,522,976 | 6/1996 | Campet et al. | 204/298.13 |
| 5,523,615 | 6/1996 | Cho et al. | 257/632 |
| 5,525,857 | 6/1996 | Gnade et al. | 313/309 |
| 5,536,965 | 7/1996 | Beratan et al. | 257/444 |
| 5,548,159 | 8/1996 | Jeng | 257/634 |
| 5,561,318 | 10/1996 | Gnade et al. | 257/638 |
| 5,661,344 | 8/1997 | Havemann et al. | 257/758 |
| 5,747,880 | 5/1998 | Havemann et al. | 257/759 |
| 5,789,819 | 8/1998 | Gnade et al. | 257/759 |

OTHER PUBLICATIONS

D. Basmadjian, G. N. Fulford, B.I. Parsons, and D.S. Montgomery, the Control of the Pore, Volume and Pore Size Distribution in Alumina and Silica Gels by the Addition of Water Soluble Organic Polymers Dec. 1962, Journal of Catalysis, vol. 1, No. 6, pp. 547–563.

U.S. application No. 08/250,747, Gnade et al., filed May 22, 1994.

U.S. application No. 08/746,689, Gnade et al., filed Nov. 14, 1996.

U.S. application No. 08/746,688, Smith et al., filed Nov. 14, 1996.

U.S. application No. 08/748,922, Smith et al., filed Nov. 14, 1996.

U.S. application No. 08/748,925, Smith et al., filed Nov. 14, 1996.

U.S. application No. 08/746,679, Smith et al., filed Nov. 14, 1996.

U.S. application No. 08/746,680, Smith et al., filed Nov. 14, 1996.

U.S. application No. 08/749/194, Smith et al., filed Nov. 14, 1996.

U.S. application No. 08/748,927, Stoltz et al., filed Nov. 14, 1996.

U.S. application No. 08/748,926, Stoltz et al., filed Nov. 14, 1996.

U.S. application No. 08/749,174, Smith et al., filed Nov. 14, 1996.

U.S. application No. 08/748,921, Smith et al., filed Nov. 14, 1996.

U.S. application No. 08/746,697, Maskara et al., filed Nov. 14, 1996.

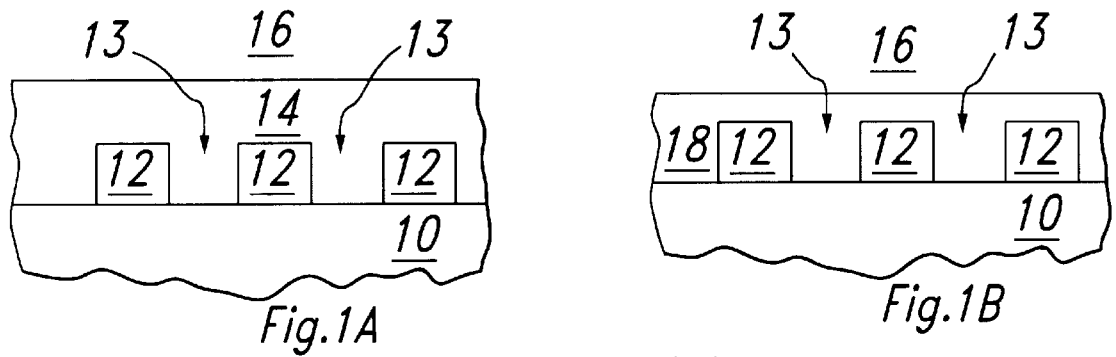
Fig.1A
Fig.1B
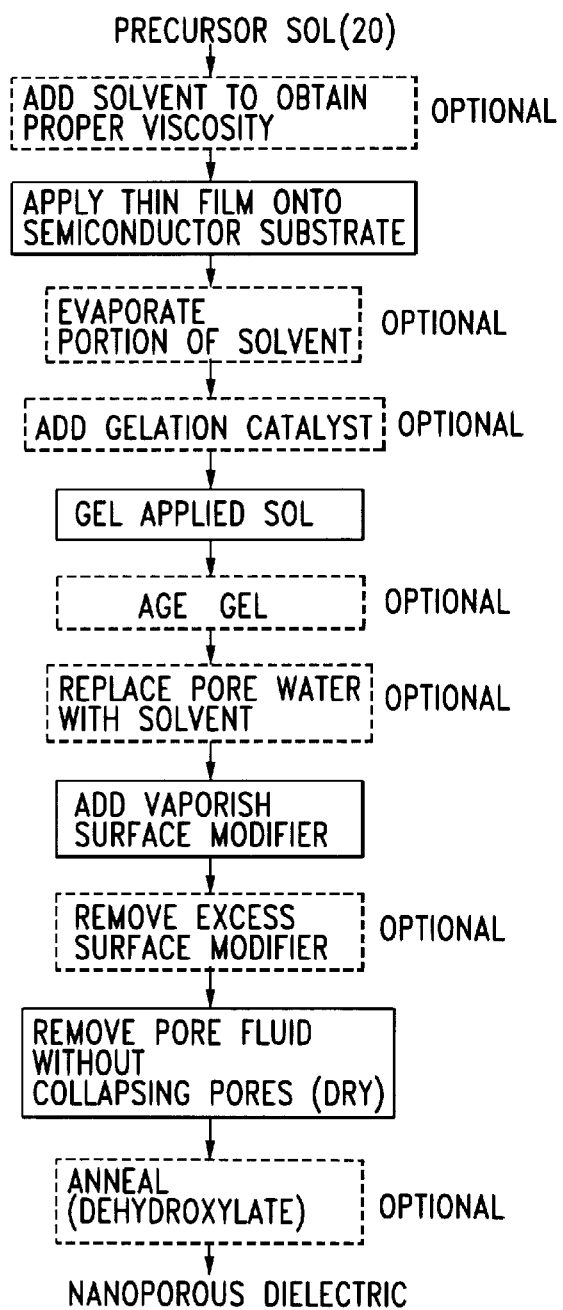
Fig. 2

NANOPOROUS DIELECTRIC THIN FILM SURFACE MODIFICATION

CROSS-REFERENCES TO RELATED INVENTIONS

This application claims priority under 35 USC § 119(e)(1) of provisional application No. 60/010,511, filed Jan. 24, 1996.

This application is related to application Ser. No. 08/247, 195, now U.S. Pat. No. 5,470,802, to Gnade, Cho and Smith; cofiled application Ser. No. 08/746,688, filed Nov. 14, 1996 by Smith, Johnston, Ackerman, and Jeng; and cofiled U.S. patent application Ser. No. 08/748,922 now U.S. Pat. No. 5,753,305, filed Nov. 14, 1996 by Smith, Johnston, Ackerman, and Jeng. These related applications are commonly assigned with this application.

FIELD OF THE INVENTION

This invention pertains generally to precursors and deposition methods for low dielectric constant thin films on semiconductor substrates, and more particularly to deposition methods suited to aerogel thin film fabrication of nanoporous dielectrics.

BACKGROUND OF THE INVENTION

Semiconductor fabricators have used sol-gel techniques to produce dense thin films in semiconductors. The word sol-gel, however, does not describe a product but a reaction mechanism whereby a sol transforms into a gel. A sol is a colloidal suspension of solid particles in a liquid. One method of forming a sol is through hydrolysis and condensation reactions. These reactions cause a multifunctional monomer in a solution to polymerize into relatively large, highly branched particles. Many monomers suitable for polymerization are metal alkoxides. For example, a tetraethylorthosilicate (TEOS) monomer may be partially hydrolyzed in water by the reaction

Si(OEt)$_4$+H$_2$O→HO—Si(OEt)$_3$+EtOH

Reaction conditions may be controlled such that, on the average, each monomer undergoes a desired number of hydrolysis reactions to partially or fully hydrolyze the monomer. TEOS that has been fully hydrolyzed becomes Si(OH)$_4$. Once a molecule has been at least partially hydrolyzed, two molecules can then link together in a condensation reaction, such as

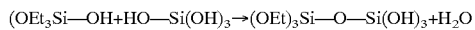

(OEt)$_3$Si—OH+HO—Si(OH)$_3$→(OEt)$_3$Si—O—Si(OH)$_3$+H$_2$O or

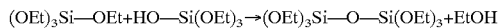

(OEt)$_3$Si—OEt+HO—Si(OEt)$_3$→(OEt)$_3$Si—O—Si(OEt)$_3$+EtOH to form an oligomer and liberate a molecule of water or ethanol. The Si—O—Si configuration in the oligomer formed by these reactions has three sites available at each end for further hydrolysis and condensation. Thus, additional monomers or oligomers can be added to this molecule in a somewhat random fashion to create a highly branched polymeric molecule from literally thousands of monomers.

Through continued reactions, one molecule in the sol may eventually reach macroscopic dimensions so that it forms a network that extends throughout the sol. At this point (called the gel point), the substance is said to be a gel. By this definition, a gel is a substance that contains a continuous solid skeleton enclosing a continuous liquid phase. As the skeleton is porous, a gel can also be described as an open-pored solid structure enclosing a pore fluid. An oligomerized metal alkoxide, as defined herein, comprises molecules formed from at least two alkoxide monomers, but does not comprise a gel.

SUMMARY OF THE INVENTION

An ungelled precursor sol may be dip-coated or spin-coated onto a substrate to form a thin film on the order of several microns or less in thickness, gelled, and dried to form a dense film. The precursor sol often comprises a stock solution, a solvent, and a gelation catalyst. This catalyst typically modifies the pH of the precursor sol in order to speed gelation. In practice, such a thin film is subjected to rapid evaporation of volatile components. Thus, the deposition, gelation, and drying phases may take place simultaneously as the film collapses rapidly to a dense film. Drying by evaporation of the pore fluid produces extreme capillary pressure in the microscopic pores of the wet gel. This pressure causes many pores to collapse and reduces the gel volume as it dries, typically by an order of magnitude or more.

A dried gel that is formed by collapsing and densifying a wet gel during drying has been termed a xerogel. U.S. patent application Ser. No. 08/247,195 now U.S. Pat. No. 5,470, 802 to Gnade, Cho and Smith discloses a process for producing an aerogel thin film on a semiconductor substrate. An aerogel is distinguishable from a xerogel primarily by a manner of drying which largely avoids pore collapse during drying of the wet gel. This results in a substantially undensified thin film that can be fabricated with almost any desired porosity (thin films with greater than 90% porosity have been demonstrated). Such films have now been found to be desirable for a low dielectric constant insulation layer in microelectronic applications.

These techniques relate to fabricating inorganic dielectric (electrically nonconductive) materials. The inorganic porous dielectrics "aerogels" are preferably nanoporous having average pore sizes less than 500 nanometers (and more preferably less than 100 nanometers and still move preferably less than 25 nanometers). Nanoporous dielectrics are of particular interest in advanced semiconductor manufacturing. The nanoporous inorganic dielectrics include the nanoporous metal oxides, particularly nanoporous silica.

Gnade et al's application teachings include a subcritical drying method. That is, they dry the gelled film at one or more sub critical pressures (from vacuum to near-critical) and preferably, at atmospheric pressure. Traditional aerogel processes, remove the pore fluid from a wet gel (dry) under supercritical pressure and temperature conditions. By removing the pore fluid in the supercritical region, vaporization of the liquid pore fluid does not take place. Instead, the fluid undergoes a constant change in density during the operation, changing from a compressed liquid to a supercritical fluid with no distinguishable state boundary. This technique avoids the capillary pressure problem entirely, since no state change boundaries ever exist in the pores.

Gnade et al's application also discloses a method of immersing a wet gel in a surface modification agent. This modifier, e.g. trimethylchlorosilane (TCMS), may impart several advantages. Some of these advantages include prevention of substantial pore collapse during drying, hydrophobicity, and reduced dielectric constant.

The immersion process could involve placing a semiconductor wafer with a wet gel in a receptacle containing liquid, adding liquid to a receptacle holding a wafer, or dispensing liquid on top of a wafer (potentially at a wafer spin station), such that the wafer surface is immersed in the liquid. It has now been found that, for microelectronic applications, immersing the wet gel may be undesirable. Several problems that may be associated with immersion are damage to the wet gel (possibly due to fluid flow forces), premature drying of the gel, and incompatibility with standard wafer processing equipment.

A method has now been found which allows a surface modification agent to be introduced without immersing the wet gel. In this new method, the surface modification agent is introduced to the reaction atmosphere in a vaporish form, e.g., a vapor, mist, aerosol, or similar form. This vaporish form may be formed from a substantially pure agent or the agent may first be combined with a solvent or other carrier. The surface modifier can then diffuse into, condense onto, and/or settle onto the wet gel and then diffuse throughout the thin film. It had previously been assumed that thin film gel processing methods would be similar to bulk gel methods. However, it has now been found that although a vaporish surface modifier diffuses too slowly to be practical in a bulk gel, it can work in a thin film. Conversely, some problems associated with immersion techniques have greater significance for thin films than for bulk gels. This vaporish introduction of the surface modification agent ensures that there are no strong fluid flows across the wafer that might damage the wet gel. It can also be compatible with standard processing equipment and can potentially be used with other reaction atmosphere controls that reduce premature drying of the gel. One additional advantage of this approach is that it allows the surface modification agent to be introduced at times that might be impractical with an immersion approach, e.g., during gelation.

Several modifications may be suggested to this basic method. One such modification is using different surface modification agents. These agents should impart at least one desirable property to the wet gel. Some examples of potentially desirable properties are hydrophobicity, reduced dielectric constant, reduction of condensation reactions, increased resistance to certain chemicals, and/or improved temperature stability. Some potential surface modifiers that may impart desirable properties include hexamethyldisilazane (HMDS), the alkyl chlorosilanes (trimethylchlorosilane (TMCS), dimethyldichlorosilane, etc.), the alkylalkoxysilanes (trimethylmethoxysilane, dimethyldimethoxysilane, etc.), phenyl compounds and fluorocarbon compounds. The useful phenyl compounds will typically follow the basic formula, $Ph_xA_ySiB_{(4-x-y)}$, where, Ph is a phenolic group, A is a reactive group such as Cl or $OCH_3$, and B are the remaining ligands which, if there are two, can be the same group or different. Some examples of these phenyl surface modification agents include compounds with 1 phenolic group such as phenyltrichlorosilane, phenyltrifluorosilane, phenyltrimethoxysilane, phenyltriethoxysilane, phenylmethylchlorosilane, phenylethyldichlorosilane, phenyldimethylethoxysilane, phenyldimethylchlorosilane, phenyldichlorosilane, phenyl (3-chloropropyl)dichlorosilane, phenylmethylvinylchlorosilane, phenethyldimethylchlorosilane, phenyltrichlorosilane, phenyltrimethoxysilane, phenyltris(trimethylsiloxy)silane, and phenylallyldichlorosilane. Other examples of these phenyl surface modification agents include compounds with 2 phenolic groups such as diphenyldichlorosilane, diphenylchlorosilane, diphenylfluorosilane, diphenylmethylchlorosilane, diphenylethylchlorosilane, diphenyldimethoxysilane, diphenylmethoxysilane, diphenylethoxysilane, diphenylmethylmethoxysilane, diphenylmethylethoxysilane and diphenyldiethoxysilane. These phenyl surface modification agents also include compounds with 3 phenolic groups such as triphenylchlorosilane, triphenylflourosilane, and triphenylethoxysilane. Another important phenyl compound, 1,3-diphenyltetramethyldisilazane, is an exception to this basic formula. These lists are not exhaustive, but do convey the basic nature of the group. The useful fluorocarbon based surface modification agents include (3,3,3-trifluoropropyl) trimethoxysilane), (tridecafluoro-1,1,2,2-tetrahydrooctyl)-1dimethylchlorsilane, and other fluorocarbon groups that have a reactive group, such as Cl or $OCH_3$, that will form covalent bonds with a hydroxyl group.

Gnade et al also teach that one may replace the water in the wet gel with a solvent before the surface modification step. This water replacement prevents reactions between the water in the wet gel and a surface modifier that is highly reactive with water. If one uses a less reactive modifier or is willing to deal with the reactions, this water replacement may be modified to either skip the water replacement step or to wait until during or after the surface modification step.

A method of forming a nanoporous dielectric on a semiconductor substrate is disclosed herein. This method may comprise the steps of providing a semiconductor substrate having a first surface and depositing a thickness of a precursor sol upon the first surface of the substrate. This precursor sol may be comprised of a reactant dispersed in solvent; where the reactant is typically selected from the group of metal alkoxides, particulate metal oxides, and organic precursors, although other precursors known in the art may be used. The method further comprises allowing the deposited sol to create a gel, where the gel comprises a porous solid and a pore fluid. The method further comprises adding a surface modification agent to said gel; where the adding is performed in a controlled atmosphere; and the agent is added in a vaporish form. The method also comprises removing the pore fluid without substantially collapsing the porous solid, thereby forming a dry, porous dielectric. Preferably, the gel is also aged. It is preferable to age the gel before introducing the surface modification agent, but it may be done after. Preferably, the dry, porous dielectric is annealed.

BRIEF DESCRIPTION OF THE DRAWINGS

The present invention, including various features and advantages thereof, may be best understood with reference to the following drawings, wherein:

FIGS. 1A–1B contain cross-sections of a semiconductor substrate at several points during deposition of a thin film according to the present invention; and FIG. 2 is a flow chart of a deposition process according to an embodiment of the present invention.

DETAILED DESCRIPTION OF THE PREFERRED EMBODIMENTS

Typical sol-gel thin film processes produce gels which collapse and densify upon drying, thus forming xerogels having limited porosity (Up to 60% with large pore sizes, but generally substantially less than 50% with pore sizes of interest). Under the uncontrolled drying conditions of xerogel film formation, many of the internal pores permanently collapse. However, in thin film aerogel formation, the pores remain substantially uncollapsed, even though there is often some shrinkage during drying. It is sometimes desirable to modify the surface of the gel's solid phase before drying.

This surface modification may be useful when drying using supercritical techniques, but can be particularly useful when using subcritical drying techniques. These subcritical techniques often use the surface modifier to help prevent permanent pore collapse during drying.

Previous techniques for introducing surface modification agents have involved immersion of the wafer in a liquid. It has now been recognized that the following criteria are desirable for introducing surface modifiers during aerogel thin film deposition, particularly where the thin film will be deposited on semiconductor wafers.

1) The process should not damage the wet gel film.
2) The process should be compatible with standard wafer processing equipment.
3) The process should work in a controlled atmosphere.
4) The process should allow other concurrent steps.

No prior art method has been found which allow meeting these conditions. However, in accordance with the present technique, it has now been found that a surface modification agent can be introduced without immersing the wet gel film. In this new method, the surface modification agent is introduced to the reaction atmosphere in a vaporish form, e.g., a vapor, mist, aerosol, or similar form. The surface modifier can then diffuse into, condense onto, and/or settle onto the wet gel and then diffuse throughout the thin film.

Referring now to FIG. 1A, a semiconductor substrate 10 (typically in wafer form) is shown. Common substrates include silicon, germanium, and gallium arsenide, and the substrate may include active devices, lower level wiring and insulation layers, and many other common structures not shown but known to those skilled in the art. Several patterned conductors 12 (e.g., of an Al-0.5% Cu composition) are shown on substrate 10. Conductors 12 typically run parallel for at least part of their length, such that they are separated by gaps 13 of a predetermined width (typically a fraction of a micron). Both the conductors and gaps may have height-to-width ratios much greater than shown, with larger ratios typically found in devices with smaller feature sizes.

In accordance with a first preferred embodiment of the present invention, a stock solution may be prepared by combining TEOS, ethanol, water and nitric acid in the approximate molar ratio 1:3.7:1:0.0007 and refluxing this solution for 1.5 hours at 80° C. to form a sol. This stock solution is typically stored below room temperature prior to use to maintain stability. The sol is further diluted using at least two solvents that differ in volatility. One combination is a relatively high volatility solvent, ethanol (v.p.=89 torr @ 32° C.) and a lower volatility solvent, 1-butanol (v.p.=31 torr @ 32° C.) in molar ratios of solvent:TEOS of 5:1 and 10:1, respectively to form a multi-solvent precursor sol. Volume ratios of ethanol and 1-butanol may be adjusted to any desired ratio depending on desired film thickness and density.

3–5 ml of this multi-solvent precursor sol may be dispensed at room temperature onto substrate 10, which is then spun at 1500 to 5000 rpm (depending on desired film thickness) for about 5–10 seconds to form sol thin film 14. This is preferably done in a saturated 1-butanol and water atmosphere 16. This permits rapid evaporation of the ethanol from film 14 without substantial evaporation of the 1-butanol and water.

At a predetermined time, a gelation catalyst such as ammonia vapor is added to the atmosphere. Preferably, the ammonia is added until a saturated vapor or near-saturated vapor is formed. As the ammonia diffuses into the sol thin film, rapid gelation is promoted. This ammonia-laden atmosphere is preferably maintained at least until gelation is complete.

FIG. 2B shows a reduced thickness sol film 18 obtained after substantially all (about 95% or more) of the ethanol has been removed. Film 18 has a known ratio of silicon to pore fluid at the gel point. This ratio is approximately equal to the ratio of TEOS to water and 1-butanol in the as-deposited sol (with minor changes due to continued reactions and incidental evaporation). To the extent that the gel is prevented from collapsing, this ratio will determine the density of the aerogel film that will be produced from the sol thin film.

After gelation, the thin film wet gel 18 comprises a porous solid and a pore fluid, and can preferably be allowed time to age at one or more controlled temperatures, e.g., about a day at room temperature. It should be noted that the pore fluid changes somewhat during processing. These changes may be due to continued reactions, evaporation/condensation, or chemical additions to the thin film. After gelation, the pore fluid may be left in place, or it may be diluted or replaced by a different fluid (e.g. replace 1-butanol and water mixture with water). Whether this fluid is identical to the as-gelled fluid or not, the pore fluid that is present during aging is sometimes referred to as "aging fluid". Aging may preferably be accomplished by letting the device sit in a near saturated aging fluid atmosphere for approximately 2 hours at about 50 degrees C. At these relatively high aging temperatures (below aging fluid boiling, but at least above 30 degrees C., but preferably above 40 degrees C., and more preferably above 50 degrees C.), it is preferred that the thin film wet gel 18 does not dry prematurely. However, it is also preferred to prevent condensation on the surface of the wet gel. This balance between preventing both drying and condensation is a motivation behind the preference for maintaining the near saturated aging fluid atmosphere. In general, different solvents and aging temperatures require different approximations of "near saturated". At 50 degrees C., it may be preferable to control the atmosphere such that it is more than 99.5% saturated with 1-Butanol. Cofiled U.S. patent application Ser. No. 08/748,922, now U.S. Pat. No. 5,753, 305 to Smith, Johnston, Ackerman, and Jeng addresses aging techniques.

Before drying, the thin film wet gel 18 may have its pore surfaces modified with a surface modification agent such as trimethylchlorosilane (TMCS). This surface modification step replaces a substantial number of the molecules on the pore walls with those of another species. Surface modification may be performed by atomizing an ethanol or other alcohol solution containing about 10% by volume TMCS above the wafer surface. It may be necessary to place a condensing device, such as an electrostatic precipitator, near the wafer surface to prevent droplets from impinging the surface. This surface modification replaces at least a portion of the reactive surface groups such as hydroxyls and alkoxyls with more stable surface groups such as methyl groups. When combined with subcritical drying, this type of modification helps control undesirable condensation reactions (and shrinkage effects) during gel drying. Typically, in some of the weak to moderate strength gels, approximately 30% of the reactive surface groups must be replaced to substantially alleviate densification during subcritical drying.

Film 18 may be dried without substantial densification by one of several methods, including supercritical fluid extraction. However, the preferred method is slow drying of the film 18 in a controlled atmosphere. After a brief reaction time between the wet gel 18 and the surface modification compound, the pore fluid is finally allowed to evaporate from the wet gel 18, forming a dry porous dielectric (dried gel).

In order to reduce the dielectric constant, it is preferable to dehydroxylate (anneal) the dried gel. This may be done by placing the wafer in a forming gas atmosphere comprised of 10 volume % H2, 90 volume % N2 at atmospheric pressure, and baking at 450° C. for approximately 30 minutes.

FIG. 2 contains a flow chart of a general method for obtaining an aerogel thin film from a precursor sol according to one embodiment of the present invention. The following table is a quick summary of some of the substances used in this method.

| Ref # | Specific Example | Functional Description | Preferred Alternates |
|---|---|---|---|
| 10 | Silicon | Semiconductor Substrate | Ge, GaAs, active devices, lower level layers |
| 12 | Al-0.5% Cu | Patterned Conductors | Al, Cu, other metals, polysilicon |
|  | TEOS | Precursor Sol Reactant | Other metal alkoxides, (TMOS), MTEOS, BTMSE, and combinations thereof, particulate metal oxides, organic precursors. |
|  | Ethanol | Precursor Sol Solvent Constituent A | Methanol, other alcohols |
|  | Water | Precursor Sol Solvent Constituent B |  |
|  | Nitric Acid | Precursor Sol Solvent Constituent C | Other acids |
|  | Ethanol | High Volatility Solvent | Methanol, other alcohols |
|  | 1-butanol | Lower Volatility Solvent | Glycols (e.g., methylene glycol, ethylene glycol), carboxylic acids, and alkanoamines. |
|  | TMCS | Surface Modification Agent | Hexamethyldisilazane (HMDS), trimethylmethoxysilane, dimethyldimethoxysilane, phenyl compounds and fluorocarbon compounds. |
|  | Ammonia | Gelation Catalyst | Ammonium hydroxide, volatile amine species, and other compounds that will raise the pH of the deposited sol. Nitric acid and other compounds that will lower the pH. |
|  | hexane | aprotic solvent | Acetone |

In accordance with a second preferred embodiment of the present invention, a stock solution may be prepared by combining TEOS, ethanol, water and nitric acid in the approximate molar ratio 1:3.7:1:0.0007 and refluxing this solution for 1.5 hours at 80° C. to form a sol. This stock solution is typically stored below room temperature prior to use to maintain stability. The sol is further diluted using at least two solvents that differ in volatility, for example, ethanol (v.p.=89 torr @ 32° C.) and 1-butanol (v.p.=31 torr @ 32° C.) in molar ratios of solvent:TEOS of 5:1 and 10:1, respectively to form a multi-solvent precursor sol. Volume ratios of ethanol and 1-butanol may be adjusted to any desired ratio depending on desired film thickness and density.

3–5 ml of this multi-solvent precursor sol may be dispensed at room temperature onto substrate 10, which is then spun at 1500 to 5000 rpm (depending on desired film thickness) for about 5–10 seconds to form sol thin film 14. This is preferably done in a saturated 1-butanol and water atmosphere 16. This permits rapid evaporation of the ethanol from film 14 without substantial evaporation of the 1-butanol and water.

At a predetermined time, a gelation catalyst such as ammonia vapor is added to the atmosphere. Preferably, the ammonia is added until a saturated vapor or near-saturated vapor is formed. As the ammonia diffuses into the sol thin film, rapid gelation is promoted. This ammonia-laden atmosphere is preferably maintained at least until gelation is complete.

FIG. 1B shows a reduced thickness sol film 18 obtained after substantially all (about 95% or more) of the ethanol has been removed. Film 18 has a known ratio of silicon to pore fluid at the gel point. This ratio is approximately equal to the ratio of TEOS to water and 1-butanol in the as-deposited sol (with minor changes due to continued reactions and incidental evaporation). To the extent that the gel is prevented from collapsing, this ratio will determine the density of the aerogel film that will be produced from the sol thin film. After gelation, the thin film wet gel 18 comprises a porous solid and a pore fluid.

Before drying, the thin film wet gel 18 may have its pore surfaces modified with a surface modification agent such as trimethylchlorosilane (TMCS). This surface modification step replaces a substantial number of the molecules on the pore walls with those of another species. Surface modification may be performed by atomizing an ethanol or other alcohol solution containing about 10% by volume TMCS above the wafer surface. This surface modification replaces at least a portion of the reactive surface groups such as hydroxyls and alkoxyls with more stable surface groups such as methyl groups. When combined with subcritical drying, this type of modification helps control undesirable condensation reactions (and shrinkage effects) during gel drying. Typically, in some of the weak to moderate strength gels, approximately 30% of the reactive surface groups must be replaced to substantially alleviate densification during subcritical drying.

Film 18 may be dried without substantial densification by one of several methods, including supercritical fluid extraction. However, the preferred method is slow drying of the film 18 in a controlled atmosphere. After a brief reaction time between the wet gel 18 and the surface modification compound, the pore fluid is finally allowed to evaporate from the wet gel 18, forming a dry porous dielectric (dried gel).

In order to reduce the dielectric constant, it is preferable to dehydroxylate (anneal) the dried gel. This may be done by placing the wafer in a forming gas atmosphere comprised of 10 volume % H2, 90 volume % N2 at atmospheric pressure, and baking at 450° C. for approximately 30 minutes.

In accordance with a third preferred embodiment of the present invention, a stock solution may be prepared by combining TEOS, water, ethylene glycol, and nitric acid and refluxing this solution to form a sol. This stock solution is typically stored below room temperature prior to use to maintain stability. If necessary to lower the viscosity, the sol may be further diluted using ethanol or have its temperature raised.

3–5 ml of this multi-solvent precursor sol may be dispensed at room temperature onto substrate 10, which is then spun at 1500 to 5000 rpm (depending on desired film thickness) for about 5–10 seconds to form sol thin film 14. The small amount of evaporation during and after deposition concentrates the sol such that gelation begins.

Film 18 has an approximately known ratio of silicon to pore fluid at the gel point. This ratio is approximately equal to the ratio of TEOS to ethylene glycol in the as-deposited sol (with minor changes due to remaining water, continued reactions and incidental evaporation). To the extent that the gel is prevented from collapsing, this ratio will determine the density of the aerogel film that will be produced from the sol thin film.

After gelation, the thin film wet gel 18 comprises a porous solid and a pore fluid, and can preferably be allowed time to age at one or more controlled temperatures, e.g., about a day at room temperature. It should be noted that the pore fluid changes somewhat during processing. These changes may be due to continued reactions, evaporation/condensation, or chemical additions to the thin film. Aging may preferably be accomplished by letting the device sit in a near saturated aging fluid atmosphere for approximately 1 hours at about 100 degrees C. It is preferred that the thin film wet gel 18 does not dry prematurely. However, it is also preferred to prevent condensation on the surface of the wet gel. This balance between preventing both drying and condensation is a motivation behind the preference for maintaining the near saturated aging fluid atmosphere. An acceptable aging approach at 100 to 140 degrees C. may be to control the ethylene glycol content of an aging atmosphere to 99±1% of saturation. Before drying, the thin film wet gel 18 may have its pore surfaces modified with a surface modification agent such as trimethylchlorosilane (TMCS). This surface modification step replaces a substantial number of the molecules on the pore walls with those of another species. Surface modification may be performed by atomizing an ethanol or other alcohol solution containing about 10% by volume TMCS above the wafer surface. This surface modification replaces at least a portion of the reactive surface groups such as hydroxyls and alkoxyls with more stable surface groups such as methyl groups. When combined with subcritical drying, this type of modification helps control undesirable condensation reactions (and shrinkage effects) during gel drying. Typically, in some of the weak to moderate strength gels, approximately 30% of the reactive surface groups must be replaced to substantially alleviate densification during subcritical drying.

Film 18 may be dried without substantial densification by one of several methods, including supercritical fluid extraction. However, the preferred method is slow drying of the film 18 in a controlled atmosphere. After a brief reaction time between the wet gel 18 and the surface modification compound, the pore fluid is finally allowed to evaporate from the wet gel 18, forming a dry porous dielectric (dried gel).

Other surface modification agents may be used in place of TMCS without departing from the scope of this invention. Some examples of other surface modification agents include hexamethyldisilazane (HMDS), trimethylmethoxysilane, dimethyldimethoxysilane, phenyl compounds and fluorocarbon compounds. In another variant, the surface modification agent may be added earlier or later than the exemplified time. For example, some or all of the surface modification might be introduced before the aging step or before gelation.

This method allows other gelation catalysts to be used in place of ammonia, for the gelation catalyst to be included in the precursor sol, or even omitted. Typically, these alternate catalysts modify the pH of the sol. It is preferable to use catalysts that raise the pH, although acid catalysts can be used with some specific reactant/solvent combinations. Typically, acid catalysis results in a longer processing times and a denser dielectric than a base catalyzed process. Some examples of other preferred gelation catalysts include the volatile amine species (low molecular weight amines) and volatile fluorine species. These catalysts may be added as a vapor or other vaporish form. Another variation of this method allows the gelation catalyst to be mixed with and included in the deposited sol. Alternatively, gelation may sometimes be induced by concentrating the sol, such as by solvent evaporation.

Many of these steps may be modified within the scope of the invention, and other steps can be included to enhance the overall process. For example, the initial thin film may be deposited by other common methods, such as dip-coating or spray-coating instead of spin-coating. The precursor sol may contain moderate sized oligomers. The precursor sol may contain only a single solvent, instead of multiple solvents. Preferably, the precursor sol may be maintained at least slightly acidic before deposition. While water might be considered a solvent in such a process, for discussion purposes herein, water is not considered a solvent.

Another modification would remove the water from the wet gel 18 before the surface modifier was added. This can preferably be performed by soaking the wafer in an atmosphere with a low relative humidity but substantially saturated with pure ethanol vapor or with a vaporish form of ethanol. The water can also be removed by immersing the wafer in pure ethanol. This water removal could be beneficial, because water will react with TMCS; however, it is not necessary. Rather than removing the water, it is preferable to leave the water in the wet gel 18, at the expense of thus using slightly more surface modifying agent.

An additional step may be added between the surface modification and the pore fluid evaporation. This step would remove unreacted surface modification agent after a brief reaction time between the wet gel 18 and the surface modification compound. The agent can be removed by immersing the wafer in an aprotic solvent (e.g., acetone, hexane) and allowing excess solvent to drain. After this solvent exchange, the pore fluid is finally allowed to evaporate from the wet gel 18, forming a dry porous dielectric (dried gel). This immersion step is not preferred due to the possibility of damaging the gel. Alternatively, solvent exchange may be performed using a vaporous introduction of the solvents. This vaporous exchange is not preferred due to the required processing time.

Other examples of modifications involve the reaction atmosphere and/or temperature. Also coating and gelation need not be performed in the same chamber or even in the same atmosphere. For instance, coating may be done without a controlled ambient (particularly if the low volatility components do not evaporate rapidly at room conditions), or in an ambient that also prevents evaporation of high volatility components. Although it is not usually preferred, due to the possibility of damaging the gel, under some conditions, the reaction atmosphere may have its temperature elevated above the substrate temperature in order to condense the vaporish surface modifier onto the sol and/or gel. Additionally, the substrate may have its temperature elevated to speed surface modification and/or gelation. Also, total pressure and/or temperature may be varied to further control evaporation rates and/or gel time. Elevated temperature processing is typically performed at no less than 40° C.; however, 50° C. is preferred, and 70° C. is more preferred. When working at elevated temperatures, care should be taken (e.g., the partial pressures in the reaction atmosphere should be high enough) to prevent solvent boiling.

Although TEOS has been used as a representative example of a reactant, other metal alkoxides may be used either alone or in combination with TEOS or each other to form a silica network. These metal alkoxides include tetramethylorthosilicate (TMOS), methyltriethoxysilane (MTEOS), 1,2-Bis(trimethoxysilyl)ethane (BTMSE), combinations thereof, and other metal alkoxides known in the art. A sol may also be formed from alkoxides of other metals known in the art such as aluminum and titanium. Some other precursor sols known in the art include particulate metal oxides and organic precursors. Two representative particulate metal oxides are pyrogenic (fumed) silica and colloidal silica. Some representative organic precursors are melamine, phenol furfural, and resorcinol. In addition to alternate reactants, alternate solvents may also be used. Some examples of preferred alternates for ethanol are methanol and the other higher alcohols. Other acids may be used in place of the nitric acid. Other solvents may be used in place of 1-butanol as the lower volatility solvent. Some preferred alternates are the glycols, carboxylic acids, and alkanoamines. Examples of the glycols are glycerol (1,2,3-propanetriol), ethylene glycol (1,2-ethanediol), propylene glycol (1,2-propanediol), trimethylene glycol (1,3-propanediol), diethylene glycol, triethylene glycol, and the poly(oxypropylene)glycols. The general formula for the poly(oxypropylene)glycols is

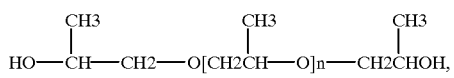

where n can vary. Examples of the carboxylic acids are ethanoic acid (acetic acid), formic acid, propanoic acid, butyric acid, fluoroacetic acid, bromoacetic acid, glycolic acid, and propenoic acid. Examples of the alkanoamines are monoethanolamine, diethanolamine, monoisopropanolamine, and diisopropanolamine. By themselves, the carboxylic acids or alkanoamines will significantly alter the pH of the sol. Thus, additional means are required to maintain the sol's pH. Another modification is to include the relatively high volatility solvent and/or the low volatility solvent in the stock solution before the stock solution is refluxed.

When changing solvents, this can change the optimum processing times/temperatures and the need for atmospheric control. A lower volatility solvent may need little or no atmospheric control during application, and less control (than a high volatility solvent) during aging. For example, an ethylene glycol solvent based gel can be aged for approximately 1 minute at 140 degrees C. or 5 minutes at 100 degrees C. However, it may still be preferable to control the ethylene glycol content of an aging atmosphere to 99±1%. A second approach to reduce drying and condensation concurrently is to use a slightly supersaturated aging fluid atmosphere, but place a liquid condensing device, such as an electrostatic precipitator, near the wafer surface.

An additional modification is to allow and/or promote the formation of moderate sized (15 to 150 monomers per molecule) oligomers in the precursor sol. These larger oligomers may speed the gelation process in the deposited sol. A sol containing large oligomers may have a higher viscosity than a sol with small oligomers. However, as long as the viscosity is stable, this higher viscosity can be compensated by methods known in the art, such as adjusting solvent ratios and spin conditions. To help achieve this desired stable viscosity, the oligomerization may need to be slowed or substantially halted before deposition. Potential methods of promoting oligomerization might include heating the precursor sol, evaporating solvent, or adding small amounts of a gelation catalyst such as ammonium hydroxide. Potential methods of retarding oligomerization might include cooling the precursor sol, diluting the sol with a solvent, or restoring the precursor sol to a pH that minimizes condensation and gelation (Nitric acid could be used in conjunction with the ammonium hydroxide exemplified above).

Another modification is to modify the surface and then dry using a supercritical method. While the surface modifier may not be needed to prevent pore collapse, it can still be used to impart desirable properties to the dried gel. Some examples of potentially desirable properties such as hydrophobicity, reduced dielectric constant, increased resistance to certain chemicals, and improved temperature stability were listed above. However, there are other potential applications for nanoporous dielectrics that may have different desirable properties. Examples of some other potentially desirable properties include hydrophilicity, increased electrical conductivity, increased dielectric breakdown voltage, increased reactivity with certain chemicals, and increased volatility. This list is not exhaustive. However, it shows that, depending upon the application, many different types of properties may be desirable. Thus, it is clear that many other materials that will form covalent bonds with hydroxyl groups are potential surface modifiers that may impart other potentially desirable properties.

Although the present invention has been described with several sample embodiments, various changes and modifications may be suggested to one skilled in the art. It is intended that the present invention encompass such changes and modifications as fall within the scope of the appended claims.

We claim:

1. A method for forming a nanoporous dielectric on a semiconductor substrate; the method comprising the steps of:
   a) providing a semiconductor substrate having a first surface;
   b) depositing a thickness of a precursor sol upon said first surface;
   c) allowing said deposited sol to create a gel, wherein said gel includes a porous solid and a pore fluid;
   d) adding a surface modification agent to said gel, wherein said agent is added in a vaporish form; and
   e) removing said pore fluid while maintaining said porous solid substantially uncollapsed, thereby forming a dry, porous dielectric.

2. The method of claim 1, further comprising the step of: aging said gel.

3. The method of claim 2, wherein:
said aging step begins before said adding step.

4. The method of claim 1, further comprising the step of: annealing said dry, porous dielectric.

5. The method of claim 1, wherein:
said pore fluid includes pore water; and
further including the step of extracting said pore water from said pore fluid before said removing pore fluid step.

6. The method of claim 5, wherein:
said extracting step occurs before said adding step.

7. The method of claim 5, wherein:
said extracting step includes preventing liquid immersion of said gel.

8. The method of claim 1, wherein:
said surface modification agent is selected from the group consisting of trimethylchlorosilane, hexamethyldisilazane, trimethylmethoxysilane, dimethyldimethoxysilane, phenyl compounds and fluorocarbon compounds.

9. The method of claim 1, wherein:
said surface modification agent is trimethylchlorosilane.

10. The method of claim 1, wherein:
said precursor sol is comprised of a reactant dispersed in solvent; wherein said reactant is selected from the group consisting of metal alkoxides, particulate metal oxides, and organic precursors.

11. The method of claim 10, wherein:
said reactant is a metal alkoxide selected from the group consisting of tetraethylorthosilicate, tetramethylorthosilicate, methyltriethoxysilane, 1,2-Bis(trimethoxysilyl)ethane and combinations thereof.

12. The method of claim 1, wherein:
said adding is performed in an atmosphere, and further including keeping the temperature of said atmosphere higher than the temperature of said substrate, at least during said addition step.

13. The method of claim 1, wherein
the temperature of said substrate is at least 40 degrees Celsius during at least a portion of said adding step.

14. The method of claim 1, wherein:
said surface modification agent is added as a mist.

15. The method of claim 1, wherein:
said pore fluid removal occurs at least one pressure, said pressure less than the critical point of the pore fluid.

16. The method of claim 1, wherein:
only a portion of said surface modification agent reacts with said gel, thereby leaving unreacted portions of said surface modification agent; and
further including removing said unreacted portions of said surface modification agent from said gel before removing said pore fluid.

17. The method of claim 1, wherein said pore fluid includes pore water, at least during sad adding step.

18. The method of claim 1, wherein said surface modification agent is added as an aerosol.

19. A method for forming a nanoporous dielectric on a semiconductor substrate; the method comprising the steps of:
a) providing a semiconductor substrate having a first surface;
b) depositing a thickness of an aerogel precursor sol upon said first surface of said substrate; wherein
said precursor sol is comprised of a reactant dispersed in solvent; wherein said reactant is selected from the group consisting of metal alkoxides, particulate metal oxides, and organic precursors; and
a portion of said reactant has been transformed into oligomers having at least 15 monomers per oligomer;
c) allowing said deposited sol to create a gel, wherein said gel includes a porous solid and a pore fluid;
d) adding a surface modification agent to said gel, wherein said agent is added in a vaporish form; and
e) removing said pore fluid without substantially collapsing said porous solid, thereby forming a dry, porous dielectric.

20. The method of claim 19, wherein:
said precursor sol does not substantially gel during said deposition.

21. The method of claim 19, wherein:
said reactant is a metal alkoxide selected from the group consisting of tetraethylorthosilicate, tetramethylorthosilicate, methyltriethoxysilane, 1,2-Bis(trimethoxysilyl)ethane and combinations thereof.

22. A method for forming a nanoporous dielectric on a semiconductor substrate; the method comprising the steps of:
a) providing a semiconductor substrate having a first surface;
b) depositing a thickness of a precursor sol upon said first surface;
c) allowing said deposited sol to create a gel, wherein said gel includes a porous solid and a pore fluid;
d) adding a surface modification agent to said gel, wherein said agent is added in a form selected from the group consisting of vapor, mist, and aerosol,
wherein said adding is performed in an atmosphere, and further including keeping the temperature of said atmosphere higher than the temperature of said substrate, at least during said adding step; and
e) removing said pore fluid while maintaining said porous solid substantially uncollapsed, thereby forming a dry, porous dielectric.

* * * * *